United States Patent
Bopp et al.

(10) Patent No.: US 8,568,177 B2
(45) Date of Patent: Oct. 29, 2013

(54) ELECTRICAL CONNECTORS AND PRINTED CIRCUITS HAVING BROADSIDE-COUPLING REGIONS

(71) Applicant: Tyco Electronics Corporation, Berwyn, PA (US)

(72) Inventors: Steven Richard Bopp, Jamestown, NC (US); Neil Ktul Nay, Kernersville, NC (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 13/864,043

(22) Filed: Apr. 16, 2013

(65) Prior Publication Data

US 2013/0225011 A1     Aug. 29, 2013

Related U.S. Application Data

(63) Continuation of application No. 12/849,593, filed on Aug. 3, 2010, now Pat. No. 8,435,082.

(51) Int. Cl.
*H01R 24/00* (2011.01)

(52) U.S. Cl.
USPC .......................................................... 439/676

(58) Field of Classification Search
USPC ................ 439/676, 941, 620.21, 955, 188; 307/147, 89, 91; 333/1, 5
See application file for complete search history.

(56) References Cited

U.S. PATENT DOCUMENTS

| | | |
|---|---|---|
| 5,299,956 A | 4/1994 | Brownell et al. |
| 5,310,363 A | 5/1994 | Brownell et al. |
| 5,432,484 A | 7/1995 | Klas et al. |
| 5,454,738 A | 10/1995 | Lim et al. |
| 5,470,244 A | 11/1995 | Lim et al. |
| 5,700,167 A | 12/1997 | Pharney et al. |
| 5,967,853 A | 10/1999 | Hashim |
| 5,997,358 A | 12/1999 | Adriaenssens et al. |
| 6,089,923 A | 7/2000 | Phommachanh |
| 6,107,578 A | 8/2000 | Hashim |

(Continued)

FOREIGN PATENT DOCUMENTS

| | | |
|---|---|---|
| EP | 0901201 | 3/1999 |
| EP | 0940890 | 9/1999 |

(Continued)

OTHER PUBLICATIONS

International Search Report, International Application No. PCT/US2010/002278, International Filing Date Aug. 19, 2010.

(Continued)

*Primary Examiner* — Alexander Gilman

(57) ABSTRACT

An electrical connector that includes a circuit board having a board substrate that has opposite board surfaces and a thickness measured along an orientation axis that extends between the opposite board surfaces. The circuit board has associated pairs of input and output terminals and signal traces that electrically connect the associated pairs of input and output terminals. The input and output terminals being configured to communicatively coupled to mating and cable conductors, respectively. Each associated pair of input and output terminals is electrically connected through a corresponding signal trace that has a conductive path extending along the board substrate between the corresponding input and output terminals. At least two signal traces form a broadside-coupling region in which the conductive paths of the at least two signal traces are stacked along the orientation axis and spaced apart through the thickness and extend parallel to each other for a crosstalk-reducing distance.

20 Claims, 10 Drawing Sheets

(56) References Cited

U.S. PATENT DOCUMENTS

| | | |
|---|---|---|
| 6,116,964 A | 9/2000 | Goodrich et al. |
| 6,139,371 A | 10/2000 | Troutman et al. |
| 6,186,834 B1 | 2/2001 | Arnett et al. |
| 6,231,397 B1 | 5/2001 | de la Borbolla et al. |
| 6,270,381 B1 | 8/2001 | Adriaenssens et al. |
| 6,317,011 B1 | 11/2001 | Barnett et al. |
| 6,350,158 B1 | 2/2002 | Arnett et al. |
| 6,443,777 B1 | 9/2002 | McCurdy et al. |
| 6,464,541 B1 | 10/2002 | Hashim et al. |
| 6,522,152 B1 | 2/2003 | Tonti et al. |
| 6,558,207 B1 | 5/2003 | Pepe et al. |
| 6,840,779 B2 | 1/2005 | Eberle et al. |
| 6,840,816 B2 | 1/2005 | Aekins |
| 6,866,548 B2 | 3/2005 | Hashim |
| 7,025,635 B2 | 4/2006 | Chang |
| 7,038,554 B2 | 5/2006 | Seefried |
| 7,074,092 B1 | 7/2006 | Green et al. |
| 7,140,024 B2 | 11/2006 | Kaulgud et al. |
| 7,140,924 B2 | 11/2006 | Redfield et al. |
| 7,153,168 B2 | 12/2006 | Caveney et al. |
| 7,166,000 B2 | 1/2007 | Pharney |
| 7,179,131 B2 | 2/2007 | Caveney et al. |
| 7,182,649 B2 | 2/2007 | Caveney et al. |
| 7,186,148 B2 | 3/2007 | Hashim |
| 7,190,594 B2 | 3/2007 | Hashim et al. |
| 7,201,618 B2 | 4/2007 | Ellis et al. |
| 7,281,957 B2 | 10/2007 | Caveney |
| 7,294,025 B1 | 11/2007 | Chen |
| 7,309,261 B2 | 12/2007 | Caveney et al. |
| 7,314,393 B2 | 1/2008 | Hashim |
| 7,341,493 B2 | 3/2008 | Pepe et al. |
| 7,357,683 B2 | 4/2008 | Caveney et al. |
| 7,364,470 B2 | 4/2008 | Hashim |
| 7,367,849 B2 | 5/2008 | Wang et al. |
| 7,381,098 B2 | 6/2008 | Hammond, Jr. et al. |
| 7,402,085 B2 | 7/2008 | Hammond, Jr. et al. |
| 7,407,417 B2 | 8/2008 | Pepe et al. |
| 7,410,367 B2 | 8/2008 | Hashim et al. |
| 7,442,092 B2 | 10/2008 | Caveney et al. |
| 7,452,246 B2 | 11/2008 | Caveney et al. |
| 7,481,678 B2 | 1/2009 | Aekins |
| 7,481,681 B2 | 1/2009 | Caveney et al. |
| 7,485,004 B2 | 2/2009 | Liu et al. |
| 7,544,088 B2 | 6/2009 | Caveney et al. |
| 7,572,148 B1 | 8/2009 | Pepe et al. |
| 7,575,482 B1 | 8/2009 | Pepe et al. |
| 7,628,656 B2 | 12/2009 | Shields et al. |
| 7,641,521 B2 | 1/2010 | Pepe et al. |
| 7,658,651 B2 | 2/2010 | Pepe et al. |
| 7,686,649 B2 | 3/2010 | Pepe et al. |
| 7,785,154 B2 | 8/2010 | Peng |
| RE41,699 E | 9/2010 | Itano et al. |
| 7,794,286 B2 | 9/2010 | Abu Ghazaleh et al. |
| 7,823,281 B2 | 11/2010 | Caveney et al. |
| 7,824,231 B2 | 11/2010 | Marti et al. |
| 7,837,513 B2 | 11/2010 | Millette et al. |
| 7,857,362 B2 | 12/2010 | Deblock |
| 7,857,635 B2 | 12/2010 | Goodrich et al. |
| 7,874,879 B2 | 1/2011 | Caveney et al. |
| 7,914,345 B2 | 3/2011 | Bopp et al. |
| 7,927,152 B2 | 4/2011 | Pepe et al. |
| 7,967,644 B2 | 6/2011 | Pepe et al. |
| 8,016,621 B2 | 9/2011 | Bopp et al. |
| 8,128,436 B2 | 3/2012 | Bopp et al. |
| 8,187,040 B2 | 5/2012 | Pepe et al. |
| 8,282,425 B2 | 10/2012 | Bopp et al. |
| 8,287,316 B2 | 10/2012 | Pepe et al. |
| 2001/0008189 A1 | 7/2001 | Reede |
| 2001/0014563 A1 | 8/2001 | Morita et al. |
| 2004/0127105 A1 | 7/2004 | Itano et al. |
| 2004/0146002 A1 | 7/2004 | Azadet |
| 2004/0224564 A1 | 11/2004 | Wan et al. |
| 2005/0026509 A1 | 2/2005 | Chang |
| 2005/0136747 A1 | 6/2005 | Caveney et al. |
| 2005/0181676 A1 | 8/2005 | Caveney et al. |
| 2005/0253662 A1 | 11/2005 | Seefried |
| 2005/0282442 A1 | 12/2005 | Hyland et al. |
| 2006/0121790 A1 | 6/2006 | Hashim |
| 2006/0134992 A1 | 6/2006 | Green et al. |
| 2007/0015417 A1 | 1/2007 | Caveney et al. |
| 2007/0117469 A1 | 5/2007 | Caveney et al. |
| 2007/0123112 A1 | 5/2007 | Caveney et al. |
| 2007/0212945 A1 | 9/2007 | Wang et al. |
| 2007/0212946 A1 | 9/2007 | Bert et al. |
| 2007/0254529 A1 | 11/2007 | Pepe et al. |
| 2007/0259571 A1 | 11/2007 | Chen |
| 2007/0293094 A1 | 12/2007 | Aekins |
| 2008/0045090 A1 | 2/2008 | Caveney |
| 2008/0171454 A1 | 7/2008 | Liu et al. |
| 2008/0239937 A1 | 10/2008 | Erickson et al. |
| 2008/0268710 A1 | 10/2008 | Hashim et al. |
| 2008/0305680 A1 | 12/2008 | Little et al. |
| 2008/0305692 A1 | 12/2008 | Little et al. |
| 2008/0311778 A1 | 12/2008 | Aekins |
| 2009/0075523 A1 | 3/2009 | Caveney et al. |
| 2009/0104821 A1 | 4/2009 | Marti et al. |
| 2009/0258545 A1 | 10/2009 | Pepe et al. |
| 2009/0269978 A1 | 10/2009 | Pepe et al. |
| 2009/0305563 A1 | 12/2009 | Pepe et al. |
| 2009/0318033 A1 | 12/2009 | Tobey |
| 2010/0041278 A1 | 2/2010 | Bopp et al. |
| 2010/0055969 A1 | 3/2010 | Straka et al. |
| 2010/0136835 A1 | 6/2010 | Hashim et al. |
| 2010/0221956 A1 | 9/2010 | Pepe et al. |
| 2011/0053428 A1 | 3/2011 | Pepe et al. |
| 2011/0053430 A1 | 3/2011 | Bopp et al. |
| 2011/0053431 A1 | 3/2011 | Bopp et al. |
| 2011/0143605 A1 | 6/2011 | Pepe |
| 2011/0171858 A1 | 7/2011 | Pepe et al. |
| 2011/0250802 A1 | 10/2011 | Pepe et al. |
| 2011/0306250 A1 | 12/2011 | Bopp et al. |
| 2012/0034822 A1 | 2/2012 | Bopp et al. |

FOREIGN PATENT DOCUMENTS

| | | |
|---|---|---|
| EP | 1406354 | 4/2004 |
| EP | 1596478 | 5/2005 |
| GB | 2438746 | 12/2007 |
| WO | WO2007/009020 | 1/2007 |
| WO | WO2009/131640 | 10/2009 |

OTHER PUBLICATIONS

Annex to Form PCT/ISA/206, Communication Relating to the Results of the Partial International Search Report, Int'l Appln. No. PCT/2010/002279, Int'l Filing Date Aug. 19, 2010.
International Search Report, International Search Report No. PCT/US2010/002285, International Filing Date Aug. 19, 2010.
International Search Report, International Application No. PCT/US2011/001341, International Filing Date Jul. 29, 2011.

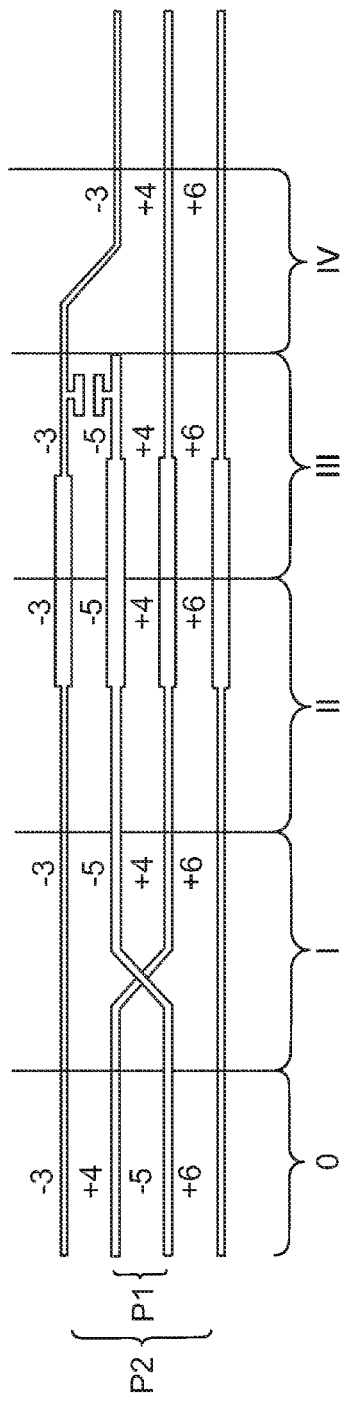
FIG. 17
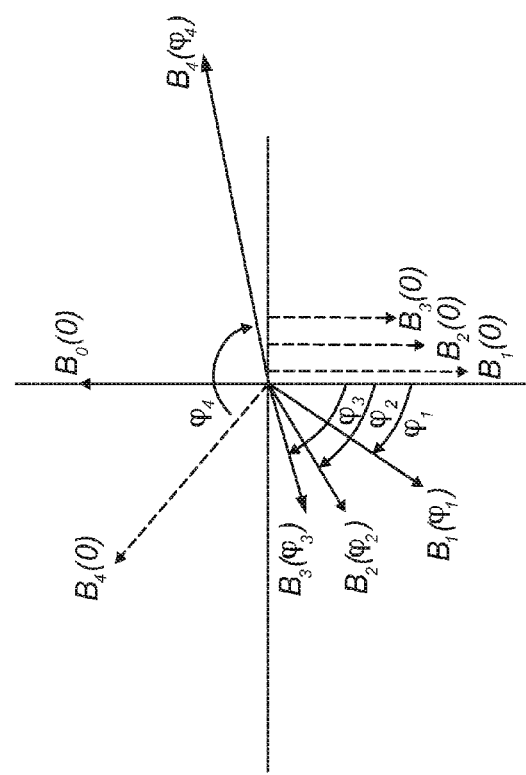
FIG. 18
FIG. 19

$$B_{II}(\psi_{II}) = B_I(\varphi_I) + B_2(\varphi_2)$$

$$B_{III}(\psi_{III}) = B_{II}(\varphi_{II}) + B_3(\varphi_3)$$

$$B_4(\varphi_4) = -B_{III}(\psi_{III})$$

ELECTRICAL CONNECTORS AND PRINTED CIRCUITS HAVING BROADSIDE-COUPLING REGIONS

CROSS-REFERENCE TO RELATED APPLICATIONS

The present application is a continuation of U.S. application Ser. No. 12/849,593, filed on Aug. 3, 2010, which is incorporated by reference in its entirety.

The subject matter described herein includes subject matter similar to subject matter described in U.S. patent application Ser. No. 12/547,321, filed Aug. 25, 2009 and entitled "ELECTRICAL CONNECTOR WITH SEPARABLE CONTACTS"; U.S. patent application Ser. No. 12/547,211, filed Aug. 25, 2009 and entitled "ELECTRICAL CONNECTORS WITH CROSSTALK COMPENSATION," and U.S. patent application Ser. No. 12/547,245, filed Aug. 25, 2009 and entitled "ELECTRICAL CONNECTOR HAVING AN ELECTRICALLY PARALLEL COMPENSATION REGION," each of which is incorporated by reference in the entirety.

BACKGROUND OF THE INVENTION

The subject matter herein relates generally to electrical connectors, and more particularly, to electrical connectors that utilize differential pairs and experience offending crosstalk and/or return loss.

Electrical connectors that are commonly used in telecommunication systems, such as modular jacks and modular plugs, may provide interfaces between successive runs of cable in telecommunication systems and between cables and electronic devices. The electrical connectors may include mating conductors that are arranged according to known industry standards, such as Electronics Industries Alliance/Telecommunications Industry Association ("EIA/TIA")-568. Performance of the electrical connectors may be negatively affected by, for example, at least one of near-end crosstalk (NEXT) loss and return loss. In order to improve the performance of the electrical connectors, techniques are used to at least one of provide compensation for the NEXT loss and improve the return loss.

Such techniques have focused on arranging the mating conductors with respect to each other within the electrical connector or introducing components to provide the compensation, e.g., compensating NEXT. For example, compensating signals may be created by crossing the conductors such that a coupling polarity between the two conductors is reversed. Compensating signals may also be created in a circuit board of the electrical connector by capacitively coupling digital fingers to one another. However, the above techniques may have limited capabilities for providing crosstalk compensation or for improving return loss.

Thus, there is a need for additional techniques to improve the electrical performance of the electrical connector by at least one of reducing crosstalk and improving return loss.

BRIEF DESCRIPTION OF THE INVENTION

In one embodiment, an electrical connector is provided that includes mating conductors configured to engage plug contacts from a modular plug at a mating interface. The mating conductors comprise differential pairs. The electrical connector includes a circuit board having a board substrate that has opposite board surfaces and a thickness measured along an orientation axis that extends between the opposite board surfaces. The circuit board has associated pairs of input and output terminals and signal traces that electrically connect the associated pairs of input and output terminals. The input terminals are communicatively coupled to the mating conductors and the output terminals are configured to communicatively couple to cable conductors of a communication cable. Each associated pair of input and output terminals is electrically connected through a corresponding signal trace that has a conductive path extending along the board substrate between the corresponding input and output terminals. At least two signal traces form a broadside-coupling region in which the at least two signal traces are stacked along the orientation axis and spaced apart by the board substrate. The at least two signal traces extending parallel to each other through the broadside-coupling region for a crosstalk-reducing distance. The at least two signal traces are electrically connected to separate differential pairs.

In another embodiment, a printed circuit configured to communicatively couple to mating and loading conductors is provided. The printed circuit includes a substrate that has opposite surfaces and a thickness measured along an orientation axis extending between the opposite surfaces. The printed circuit also includes associated pairs of input and output terminals that are attached to the substrate. The input terminals are configured to communicatively couple to the mating conductors and the output terminals are configured to communicatively couple to the loading conductors. The printed circuit also includes signal traces that electrically connect the associated pairs of input and output terminals. The signal traces comprise differential pairs. Each associated pair is electrically connected through a corresponding signal trace that has a conductive path extending along the substrate between the corresponding input and output terminals. At least two signal traces from separate differential pairs form a broadside-coupling region in which the at least two signal traces are stacked along the orientation axis and spaced apart by the board substrate. The at least two signal traces extend parallel to each other through the broadside-coupling region for a crosstalk-reducing distance.

In yet another embodiment, an electrical connector is provided that includes a housing having an interior chamber that is configured to receive a modular plug. The electrical connector also includes a terminal sub-assembly that has a loading body configured to hold cable conductors of a communication cable. The electrical connector also includes a contact sub-assembly that is at least partially disposed within the interior chamber of the housing. The contact sub-assembly includes mating conductors that are configured to engage plug contacts from the modular plug at a mating interface. The mating conductors comprise differential pairs. The contact sub-assembly also includes a circuit board having a board substrate that has opposite board surfaces and a thickness measured along an orientation axis extending between the opposite board surfaces. The circuit board has associated pairs of input and output terminals attached to the board substrate and signal traces that electrically connect the associated pairs of input and output terminals. The input terminals are communicatively coupled to the mating conductors and the output terminals are configured to communicatively couple to the cable conductors. Each associated pair of input and output terminals is electrically connected through a corresponding signal trace that has a conductive path extending along the board substrate between the corresponding input and output terminals. At least two signal traces form a broadside-coupling region in which the at least two signal traces are stacked along the orientation axis and spaced apart by the board substrate. The at least two signal traces extend parallel to each other through the broadside-coupling region for a crosstalk-reducing distance. The at least two signal traces are electrically connected to separate differential pairs.

BRIEF DESCRIPTION OF THE DRAWINGS

FIG. 17 is a crosstalk polarity diagram of the electrical connector shown in FIG. 16.

FIG. 18 illustrates vector addition for the electrical connector shown in FIG. 16.

FIG. 19 illustrates, through vector addition, an effect that NEXT stage $B_1$ has on crosstalk for the electrical connector shown in FIG. 16.

DETAILED DESCRIPTION OF THE INVENTION

Figure 1:
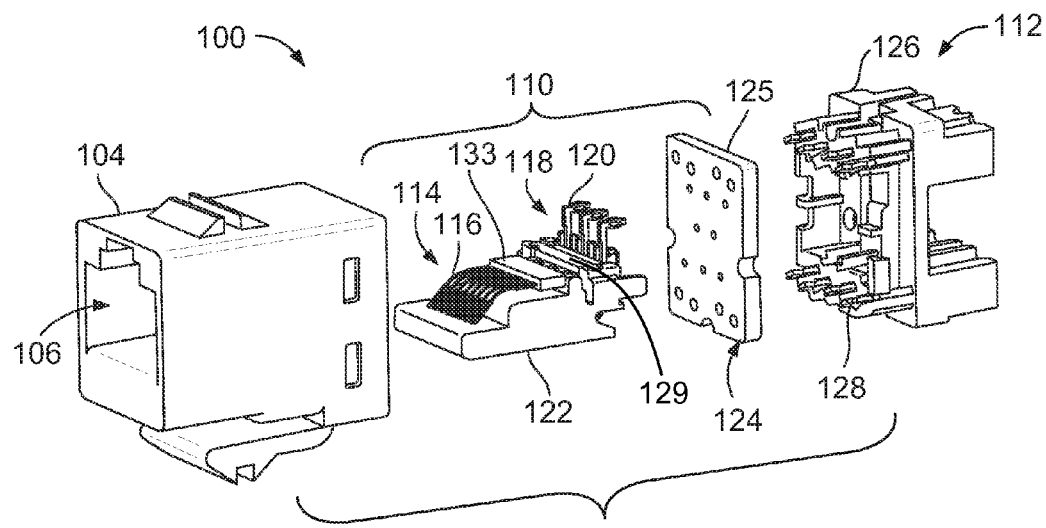
FIG. 1 is an exploded perspective view of an electrical connector formed in accordance with one embodiment.
Figure 2:
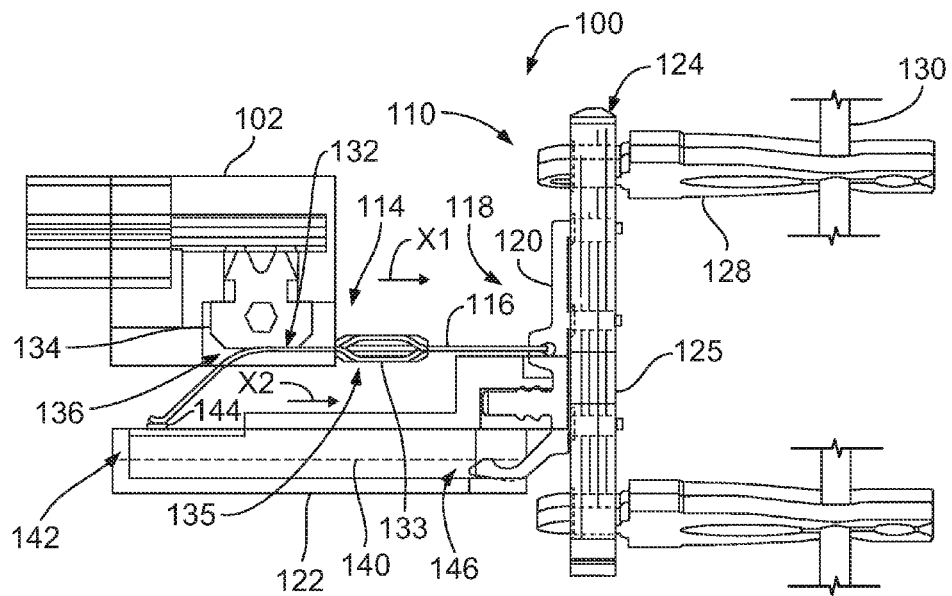
FIG. 2 is a schematic side view of the electrical connector of FIG. 1 engaging a plug connector.

FIG. 1 is an exploded perspective view of an electrical connector 100 formed in accordance with one embodiment, and FIG. 2 is a schematic side view of the electrical connector 100 engaged with a modular plug 102 (FIG. 2). As shown, the electrical connector 100 includes a connector housing 104 (FIG. 1) having an interior chamber 106 (FIG. 1) that is configured to receive the modular plug 102. The electrical connector 100 also includes a contact sub-assembly 110 and a terminal sub-assembly 112. The contact sub-assembly 110 includes an array 114 of mating conductors 116, an array 118 of intermediate contacts 120, and an assembly support 122 that holds the mating conductors 116 and the intermediate contacts 120. In the illustrated embodiment, each mating conductor 116 is electrically connected to a corresponding one intermediate contact 120. Optionally, the contact sub-assembly 110 may include a support assembly 129 for supporting the mating conductors 116. The support assembly 129 may include mounting posts and a support block that are further described in U.S. patent application Ser. No. 12/685,347, filed Jan. 11, 2010, which is incorporated by reference for the purposes of understanding the support assembly 129. However, the support assembly 129 is optional and embodiments described herein may not include the support assembly 129.

The contact sub-assembly 110 also includes a first or primary printed circuit 124 that engages the intermediate contacts 120. The printed circuit 124 may include conductive materials (e.g., traces, vias, and the like) that are deposited in a dielectric substrate 125 of the printed circuit 124. In the illustrated embodiment, the printed circuit 124 is a circuit board and the dielectric substrate 125 is a rigid board substrate. However, in alternative embodiments, the printed circuit 124 may be, for example, a flex circuit that includes a dielectric substrate that permits bending or flexing.

The terminal sub-assembly 112 includes a loading housing or body 126 (FIG. 1) and a plurality of terminal contacts 128 held by the loading body 126. For illustrative purposes, the connector housing 104 and the loading body 126 are not shown in FIG. 2. As shown in FIG. 2, the terminal contacts 128 are configured to engage loading conductors 130. The loading conductors 130 may be, for example, cable conductors from a communication cable (not shown). Optionally, the terminal contacts 128 include insulation displacement contacts (IDCs) for electrically connecting the loading conductors 130 to the printed circuit 124. Alternatively, the loading conductors 130 may be terminated to the contact sub-assembly 110 via a soldered connection, a crimped connection, and/or the like. When assembled, the contact sub-assembly 110 is held by the connector housing 104 so that the array 114 of mating conductors 116 is disposed within the interior chamber 106. The mating conductors 116 and the terminal contacts 128 are interconnected through the printed circuit 124.

Also shown in FIG. 2, each mating conductor 116 within the array 114 includes a mating surface 132 that is configured to be positioned within the interior chamber 106 (FIG. 1). The mating surfaces 132 are configured to interface with select mating or plug contacts 134 of the modular plug 102, which may be generally referred to as a mating interface 136 between the electrical connector 100 and the modular plug 102.

Optionally, the electrical connector 100 may also include a second or secondary printed circuit 140 that is disposed within a cavity of the assembly support 122. The mating conductors 116 may engage the printed circuit 140 at a mating end 142 of the printed circuit 140. The intermediate contacts 120 may electrically connect to the printed circuit 140 at a loading end 146. For example, the mating conductors 116 may engage corresponding contact pads 144 on the printed circuit 140, and the intermediate contacts 120 may engage corresponding contact pads (not shown) on the printed circuit 140. As such, the printed circuit 140 may provide parallel interconnection paths X1 and X2 from the mating interface 136 to the intermediate contacts 120 or the printed circuit 124. The interconnection path X1 extends from the mating interface 136 through the mating conductors 116 to the intermediate contacts 120. The interconnection path X2 extends from the mating interface 136 to the mating end 142 of the printed circuit 140, through the printed circuit 140 to the loading end 146, and to the intermediate contacts 120. The printed circuit 140 may have various configurations that are, for example, configured to improve the electrical performance of the electrical connector 100. Such embodiments are described in greater detail in U.S. patent application Ser. No. 12/547,245, which is incorporated by reference herein in the entirety.

In the illustrated embodiment, the electrical connector 100 is a modular connector, such as, but not limited to, an RJ-45 outlet or communication jack. However, the subject matter described and/or illustrated herein is applicable to other types of electrical connectors. In some embodiments, the arrangement of the mating conductors 116 may be at least partially determined by industry standards, such as, but not limited to, International Electrotechnical Commission (IEC) 60603-7 or Electronics Industries Alliance/Telecommunications Industry Association (EIA/TIA)-568. In an exemplary embodiment, the electrical connector 100 includes eight mating conductors 116 comprising four differential pairs P1-P4. However, the electrical connector 100 may include any number of mating conductors 116, whether or not the mating conductors 116 are arranged in differential pairs.

The plug contacts 134 of the modular plug 102 are configured to selectively engage mating conductors 116 of the array 114. When the plug contacts 134 engage the mating conductors 116 at the corresponding mating surfaces 132, offending signals that cause noise/crosstalk may be generated. The offending crosstalk (also referred to as NEXT loss) is created by adjacent or nearby conductors or contacts through capacitive and inductive coupling which yields an unwanted exchange of electromagnetic energy between a first differential pair and/or mating conductor to a second differential pair and/or mating conductor.

Techniques for providing compensation may be used along the interconnection paths X1 and X2, such as reversing the polarity of crosstalk coupling between the mating conductors/traces and/or using discrete components. By way of one example, a band 133 of dielectric material may support the mating conductors 116 as the mating conductors 116 are crossed over each other at a transition region 135 (FIG. 2). In other embodiments, non-ohmic plates and discrete components, such as, resistors, capacitors, and/or inductors may be used along interconnection paths X1 and X2 for providing compensation to reduce or cancel the offending crosstalk and/or to improve the overall performance of the connector. Also, the interconnection paths X1 and X2 may include one or more NEXT stages. A "NEXT stage," as used herein, is a region where signal coupling (i.e., crosstalk coupling) exists between conductors or pairs of conductors of different differential pairs and where the magnitude and phase of the crosstalk are substantially similar, without abrupt change. The NEXT stage could be a NEXT loss stage, where offending signals are generated, or a NEXT compensation stage, where NEXT compensation is provided.

Furthermore, as will be described in greater detail below, the printed circuit 124 may include one or more broadside-coupling regions. A "broadside-coupling region," as used herein, is collectively formed by signal traces that are configured to transmit a signal current between corresponding input and output terminals (or nodes) when the electrical connector 100 is in operation. Along a broadside-coupling region, the signal traces experience crosstalk coupling from one another that may be used for compensation to reduce or cancel the offending crosstalk and/or to improve the overall performance of the connector. The broadside-coupling region may be configured to tune the electrical connector 100. In some embodiments, the signal current may be a broadband frequency signal current.

Figure 3:
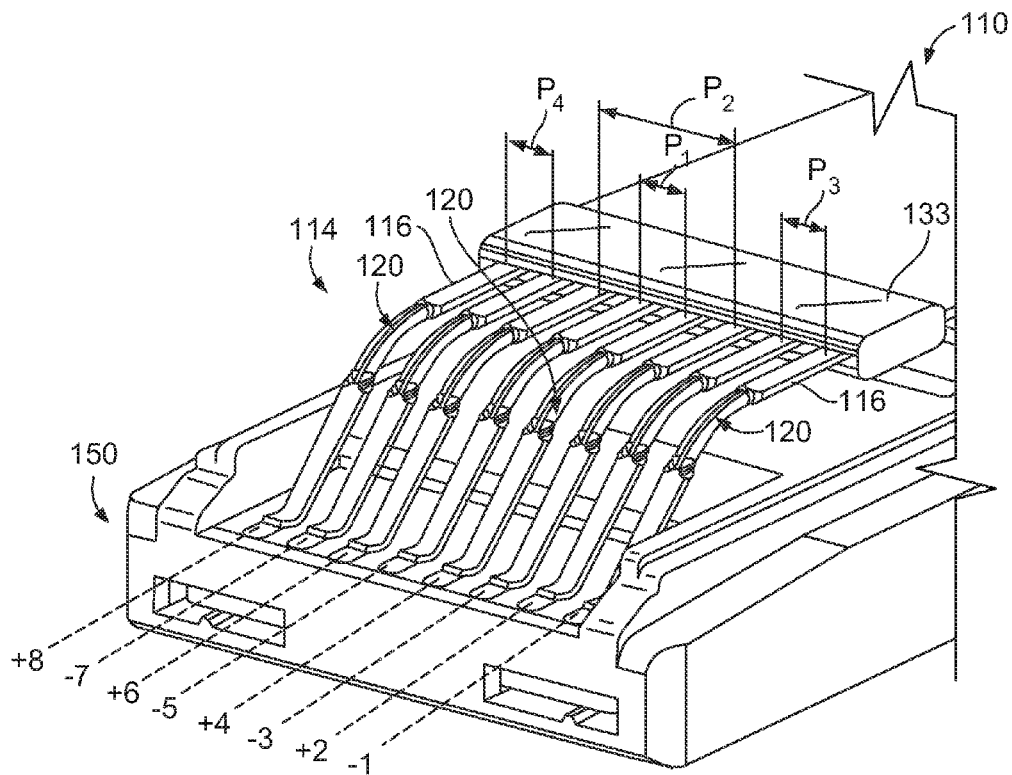
FIG. 3 is an enlarged perspective view of a mating end of the contact sub-assembly shown in FIG. 2.

FIG. 3 is an enlarged perspective view of a mating end portion 150 of the contact sub-assembly 110. By way of example, the array 114 may include eight mating conductors 116 that are arranged as a plurality of differential pairs P1-P4. Each differential pair P1-P4 consists of two associated mating conductors 116 in which one mating conductor 116 transmits a signal current and the other mating conductor 116 transmits a signal current that is about 180° out of phase with the associated mating conductor. By convention, the differential pair P1 includes mating conductors +4 and −5; the differential pair P2 includes mating conductors +6 and −3; the differential pair P3 includes mating conductors +2 and −1; and the differential pair P4 includes mating conductors +8 and −7. As used herein, the (+) and (−) represent positive and negative polarities of the mating conductors. A mating conductor labeled (+) is opposite in polarity to a mating conductor labeled (−), and, as such, the mating conductor labeled (−) carries a signal that is about 180° out of phase with the mating conductor labeled (+).

As shown in FIG. 3, the mating conductors +4 and −5 of the differential pair P1 are located between the mating conductors +6 and −3 that form the differential pair P2. In other words, the mating conductors +6 and −3 of the differential pair P2 are separated by the mating conductors +4 and −5 and are said to be split by the mating conductors +4 and −5 of the differential pair P1. When the modular plug 102 (FIG. 2) is inserted into the interior chamber 106 (FIG. 1), the plug contacts 134 engage corresponding or select mating conductors 116. Near-end crosstalk (NEXT) may develop between the mating conductors 116 of the differential pairs P1 and P2 when the plug contacts 134 engage the select mating conductors 116 along the corresponding mating surfaces 132.

Figure 4:
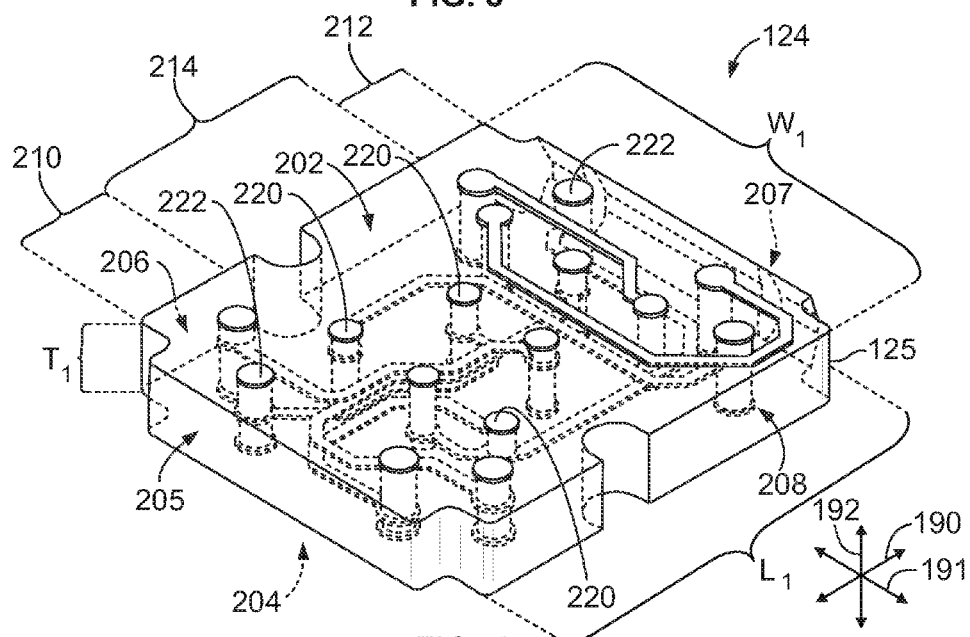
FIG. 4 is a perspective view of a printed circuit formed in accordance with one embodiment that may be used with the connector of FIG. 1.

FIG. 4 is a perspective view of the printed circuit 124 formed in accordance with one embodiment. In the illustrated embodiment, the printed circuit 124 is a circuit board and the dielectric substrate 125 is a board substrate. As shown, the dielectric substrate 125 is oriented with respect to a longitudinal axis 190 that extends along a length $L_1$ of the dielectric substrate 125, a lateral axis 191 that extends along a width $W_1$ of the dielectric substrate 125, and an orientation axis 192 that extends along a thickness $T_1$ of the dielectric substrate 125. In the illustrated embodiment, the orientation axis 192 extends in a vertical direction. The dielectric substrate 125 includes opposite substrate or board surfaces 202 and 204 that extend along the length $L_1$ and the width $W_1$, and a plurality of side walls 205-208 that extend between the board surfaces 202 and 204 along the thickness $T_1$. The thickness $T_1$ is measured along the orientation axis 192 between the board surfaces 202 and 204. In the illustrated embodiment, the dielectric substrate 125 includes a plurality of layers comprising a dielectric material. The layers may be stacked with respect to each other along the thickness $T_1$ of the dielectric substrate 125.

The printed circuit 124 or the dielectric substrate 125 may have opposite end portions 210 and 212 and a center portion 214 that extends between the end portions 210 and 212 along the longitudinal axis 190. In the illustrated embodiment, the printed circuit 124 may include input terminals 220 that are attached to the dielectric substrate 125 and located in the center portion 214. The printed circuit 124 may also include output terminals 222 that are attached to the dielectric substrate 125 and located in the end portions 210 and 212. However, in alternative embodiments, the input and output terminals 220 and 222 may be located in other portions of the dielectric substrate 125. For example, the center portion 214 may include both input and output terminals 220 and 222. Possible configurations of the input and output terminals 220 and 222 are described in greater detail in U.S. patent application Ser. No. 12/547,245, which is incorporated by reference in the entirety.

In the illustrated embodiment, the input terminals 220 are plated thru-holes or vias that electrically connect to the intermediate contacts 120 (FIG. 1). Also, the output terminals 222 may also be plated thru-holes or vias that electrically connect to the terminal contacts 128 (FIG. 1). In FIG. 4, the input terminals 220 have a smaller diameter than the output terminals 222. However, the input and output terminals 220 and 222 may have other diameters. For example, the input and output terminals 220 and 222 may have a common diameter or the input terminals 220 may have a diameter that is greater than the diameter of the output terminals 222. Furthermore, the input and output terminals 220 and 222 may be configured to receive, for example, eye-of-needle contacts. However, in alternative embodiments, the input and output terminals 220 and 222 may include other elements for electrically connecting to the intermediate and terminal contacts 120 and 128. For example, the input and output terminals 220 and 222 may include contact pads.

Also shown in FIG. 4, the input and output terminals 220 and 222 extend between the board surfaces 202 and 204 completely through the thickness $T_1$ of the dielectric substrate 125. However, in alternative embodiments, the input and output terminals 220 and 222 may only extend predetermined depths into the thickness $T_1$. Furthermore, the printed circuit 124 may have other thru-holes or vias that interconnect, for example, signal traces of the printed circuit 124.

Figure 5:
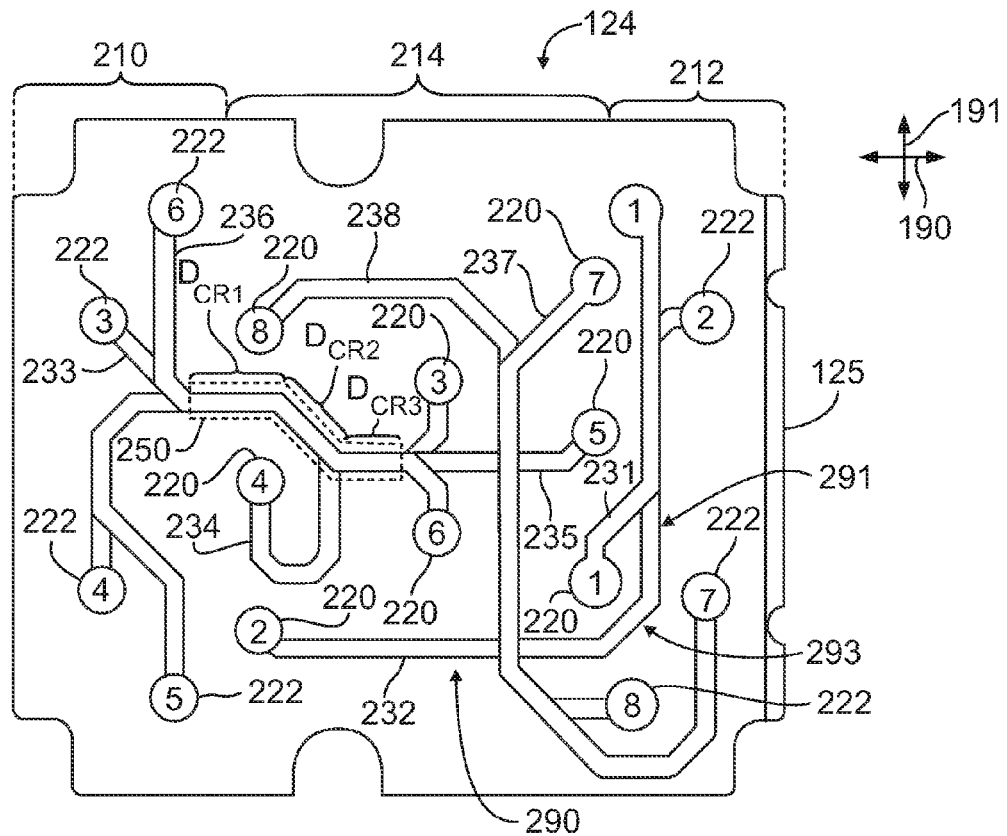
FIG. 5 is an elevation view of the printed circuit shown in FIG. 4 illustrating an arrangement of input and output terminals and signal traces.

FIG. 5 is an elevation view of the printed circuit 124. The printed circuit 124 may also include signal traces 231-238 that electrically connect the input and output terminals 220 and 222. The input and output terminals 220 and 222 may form a plurality of associated pairs. Each associated pair includes only one input terminal 220 and only one output terminal 222. The associated pairs may be communicatively coupled to one mating conductor 116 (FIG. 1) such that signal current propagating through the one mating conductor 116 propagates through the associated pair of input and output terminals 220 and 222. As used herein, when separate elements are "communicatively coupled" to one another, the separate elements are electrically connected, either directly or indirectly, to provide a communication pathway for data signals through the electrical connector. For example, the mating conductor −5 (FIG. 3), the input terminal 220 that is labeled 5 in FIG. 5, the signal trace 235, the output terminal 222 that is labeled 5, and the corresponding terminal contact 128 (FIG. 2) that is electrically and mechanically coupled to the output terminal 222 that is labeled 5 provide a communication pathway for data signals through the electrical connector and, as such, are communicatively coupled to one another.

More specifically, in the illustrated embodiment, the signal trace 231 may electrically connect an associated pair of input terminals and output terminals 220 and 222 that transmit signal current of the mating conductor −1 (FIG. 3); the signal trace 232 may electrically connect an associated pair of input terminals and output terminals 220 and 222 that transmit signal current of the mating conductor +2; the signal trace 233 may electrically connect an associated pair of input terminals and output terminals 220 and 222 that transmit signal current of the mating conductor −3; the signal trace 234 may electrically connect an associated pair of input terminals and output terminals 220 and 222 that transmit signal current of the mating conductor +4; the signal trace 235 may electrically connect an associated pair of input terminals and output terminals 220 and 222 that transmit signal current of the mating conductor −5; the signal trace 236 may electrically connect an associated pair of input terminals and output terminals 220 and 222 that transmit signal current of the mating conductor +6; the signal trace 237 may electrically connect an associated pair of input terminals and output terminals 220 and 222 that transmit signal current of the mating conductor −7; and the signal trace 238 may electrically connect an associated pair of input terminals and output terminals 220 and 222 that transmit signal current of the mating conductor +8. As shown in FIG. 5, the input terminals 220 that communicatively couple to the mating conductors −3 and +6 of the split differential pair P2 may be located at a substantially geometric center of the printed circuit 124.

Each signal trace 231-238 has a conductive path that extends along the dielectric substrate 125 between the corresponding input and output terminals 220 and 222 of the associated pair. The conductive path for each signal trace 231-238 may extend within a plane that extends parallel to the longitudinal and lateral axes 190 and 191. More specifically, the conductive path for each signal trace 231-238 may extend along a signal layer of the dielectric substrate 125 between the associated pair of input and output terminals 220 and 222. In the illustrated embodiment, the signal traces include interconnected linear portions that travel distances in various directions. By way of example with respect to the signal trace 232 only shown in FIG. 5, signal traces may include longitudinal linear portions 290 that extend in a direction that is parallel to the longitudinal axis 190, lateral linear portions 291 that extend in a direction that is parallel to the lateral axis 191, or non-orthogonal linear portions 293 that extend in a direction that is non-orthogonal with respect to the longitudinal and lateral axes 190 and 191. In alternative embodiments, the conductive paths of the signal traces may include non-linear portions or curved portions.

Also shown in FIG. 5, the signal traces 233-236 may be stacked with respect to one another to form a broadside-coupling region 250 (indicated by the dashed lines). As used herein, a "broadside-coupling region" includes a region of the printed circuit 124 in which at least two signal traces are stacked along the orientation axis 192 and spaced apart by the board substrate 125 through the thickness $T_1$ (FIG. 4) and the at least two signal traces extend parallel to one another for a crosstalk-reducing distance $D_{CRT1}$ (shown in FIG. 8). For instance, when two signal traces are stacked along the orientation axis 192 and spaced apart by the board substrate 125, a portion of the board substrate 125 separates the two signal traces and a line that is parallel to the orientation axis 192 may be drawn that intersects the two stacked signal traces. As shown in FIG. 5, the crosstalk reducing distance $D_{CRT1}$ may include three separate components $D_{CR1}$, $D_{CR2}$, and $D_{CR3}$. The sum of $D_{CR1}$, $D_{CR2}$ and $D_{CR3}$ equals the total crosstalk-reducing distance $D_{CRT1}$. A length of the crosstalk-reducing distance $D_{CRT1}$ may be configured to facilitate compensating for the offensive crosstalk. In particular embodiments, the broadside-coupling region 250 includes only three or only four signal traces. However, in alternative embodiments, the broadside-coupling region 250 includes more than four signal traces stacked with respect to one another along the orientation axis 192.

Figure 6:
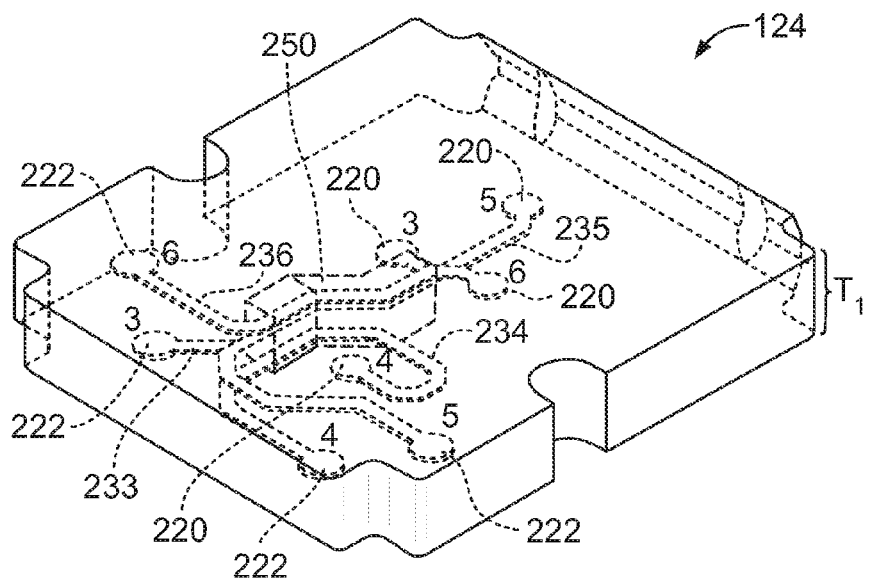
FIG. 6 is a perspective view of the printed circuit of FIG. 4 illustrating a broadside-coupling region.

FIG. 6 is a perspective view of the printed circuit 124 in which the signal traces 233-236 and the associated pairs of input and output terminals 220 and 222 corresponding to the mating conductors 3-6 have been isolated to illustrate the broadside-coupling region 250 of the printed circuit 124. The signal traces 233-236 are communicatively coupled to the mating conductors 3-6 that form the differential pairs P1 and P2 (FIG. 3). In other words, in the illustrated embodiment, the broadside-coupling region 250 includes the signal traces 233 and 236 that are communicatively coupled to the mating conductors 3 and 6 of the split differential pair P2. The broadside-coupling region 250 also includes the signal traces 234 and 235 that are communicatively coupled to the mating conductors 4 and 5 of the differential pair P1, which splits the differential pair P2. As described above, the differential pairs P1 and P2 may generate offensive crosstalk when the plug contacts 134 (FIG. 2) of the modular plug 102 (FIG. 1) engage the mating conductors 116 (FIG. 1). The broadside-coupling region 250 may be configured to facilitate compensating for the offensive crosstalk or to obtain an overall desired electrical performance. In alternative embodiments, the signal traces of the broadside-coupling region 250 may be communicatively coupled to the mating conductors of other differential pairs (e.g., P3 or P4).

Returning to FIG. 5, the input terminals 220 that are electrically connected by the signal traces 233-236 are located in the center portion 214 and the output terminals 222 that are electrically connected by the signal traces 233-236 are located at a common end portion 210. The printed circuit 124 may be configured so that the signal traces 233-236 form the broadside-coupling region 250 as the conductive paths of the signal traces 233-236 extend from the center portion 214 to the common end portion 210. However, in alternative embodiments, the conductive paths may diverge such that at least one of the signal traces 233-236 extends to the end portion 212. Also shown, the signal traces 233-236 extend between the input terminals 220 communicatively coupled with the mating conductors 4 and 8. In alternative embodiments, the signal traces of the broadside-coupling region may extend between other input terminals.

Also shown, the conductive paths of the signal traces 233-236 may change direction at least once in the broadside-coupling region 250. For example, in the broadside-coupling region 250 the signal traces 233-236 first extend in a longitudinal direction for the crosstalk-reducing distance $D_{CR3}$, then in a non-orthogonal direction for the crosstalk-reducing distance $D_{CR2}$, and then in the longitudinal direction for the crosstalk-reducing distance $D_{CR1}$.

Figure 7:
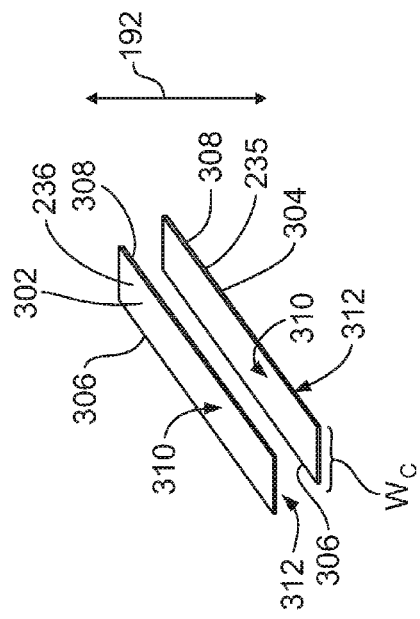
FIG. 7 illustrates an enlarged perspective view of linear portions of two stacked signal traces.

FIG. 7 illustrates an enlarged perspective view of linear portions 302 and 304 of the two stacked signal traces 236 and 235, respectively. Although the following is described with specific reference to the signal traces 236 and 235, the description may be similarly applied to the other signal traces. As used herein, signal traces are "stacked" when more than half a width of the adjacent signal trace overlaps the width of the other signal trace when viewed along the orientation axis 192. As shown, each of the linear portions 302 and 304 of the stacked signal traces 236 and 235 may include opposite first and second edges 306 and 308 and opposite broadsides 310 and 312. The broadsides 310 and 312 extend between the first and second edges 306 and 308 and face in opposite directions along the orientation axis 192. In particular embodiments, the first edges 306 of the stacked signal traces 236 and 235 may be aligned with one another along the orientation axis 192 such that the linear portions 302 and 304 completely overlap each other when viewed in a direction along the orientation axis 192. More specifically, the first edges 306 of the stacked signal traces 236 and 235 may exist in a common plane, and the second edges 308 of the stacked signal traces 236 and 235 may be also exist in a common plane. In such embodiments, the stacked signal traces 236 and 235 may have a common width $W_c$. As such, a width of the broadside-coupling region may be substantially equal to the common width $W_c$.

Also shown in FIG. 7, the broadside 312 of the signal trace 236 and the broadside 310 of the signal trace 235 may face each other and have dielectric material (not shown) extending therebetween. Accordingly, crosstalk signals may be generated through an exchange of electromagnetic energy between the stacked signal traces 235 and 236. In other words, the crosstalk signals may be generated through capacitive and inductive coupling between the broadsides 310 and 312 of the stacked signal traces 235 and 236.

Figure 8:
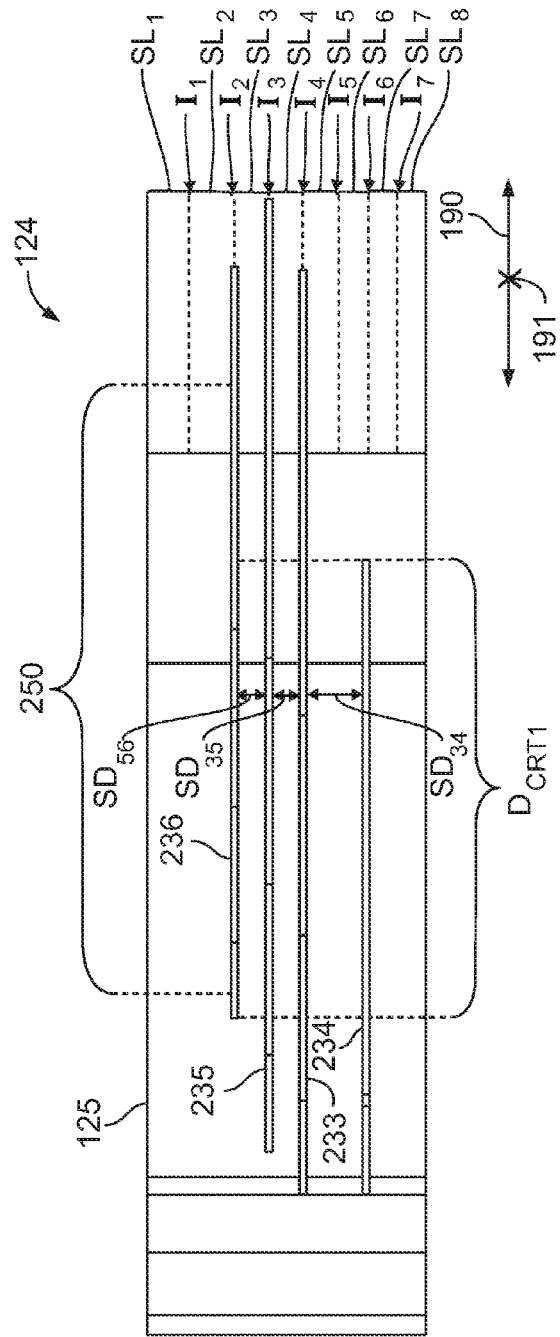
FIG. 8 is a side view of a portion of the printed circuit of FIG. 4 illustrating relative positions of the signal traces in the broadside-coupling region.

FIG. 8 is a side view of a portion of the printed circuit 124 illustrating the broadside-coupling region 250 in greater detail. In the illustrated embodiment, the dielectric substrate 125 includes signal layers $SL_1$-$SL_8$ that are stacked along interfaces $I_1$-$I_7$. The interfaces $I_1$-$I_7$ may extend substantially parallel to one another along the longitudinal and lateral axes 190 and 191. The signal traces 233-236 may be deposited along the different interfaces I. In the illustrated embodiment, the signal traces 233-236 extend along the different interfaces I throughout the broadside-coupling region 250. Also shown, the signal traces 233-236 may be separated by one or more signal layers SL.

The broadside-coupling region 250 shown in FIGS. 5, 6, and 8 is just one example that may be used with various embodiments described herein. However, the broadside-coupling region 250 may be reconfigured in various ways to obtain a desired electrical performance for the electrical connector 100 (FIG. 1). For example, in the illustrated embodiment, each signal trace 233-236 in the broadside-coupling region 250 is separated from one or more adjacent signal traces by a separation distance SD. Each separation distance SD may be substantially uniform throughout the broadside-coupling region 250. As shown, the signal trace 236 is spaced apart from the signal trace 235 by the separation distance $SD_{56}$, which may correspond to a thickness of the signal layer $SL_3$. The signal trace 235 is spaced apart from the signal trace 233 by the separation distance $SD_{35}$, which may correspond to a thickness of the signal layer $SL_4$. The signal trace 233 is spaced apart from the signal trace 234 by the separation distance $SD_{34}$, which may correspond to thicknesses of the signal layers $SL_6$ and $SL_5$.

The separation distances SD may be changed in size to tune or facilitate controlling the electrical performance of the electrical connector 100. For example, in the illustrated embodiment, the separation distances $SD_{56}$ and $SD_{35}$ are substantially equal to each other, and the separation distance $SD_{34}$ is greater than either of the separation distances $SD_{56}$ and $SD_{35}$. However, the separation distances SD may have other sizes and relationships with respect to each other. The separation distances SD may be increased or decreased between the adjacent signal traces in the broadside-coupling region 250 to tune the magnitude and polarity of the NEXT stage. As will be described in greater detail below, broadside-coupling regions that include three or four signal traces may dynamically tune both the magnitude and phase of a NEXT stage.

Another method for adjusting an effect of the broadside-coupling region 250 is changing the crosstalk-reducing distance $D_{CRT}$. The crosstalk-reducing distance $D_{CRT}$ must be at least greater than inadvertent cross-overs of the signal traces (i.e., where two signal traces extend in different directions on different signal layers and cross-over each other). For example, the crosstalk-reducing distance may be greater than at least three times the width of the signal traces. As shown in FIG. 8, the signal traces 233-236 extend parallel to each other for the crosstalk-reducing distance $D_{CRT1}$ throughout the broadside-coupling region 250. The crosstalk-reducing distance $D_{CRT}$ may be increased or decreased to control the electrical performance of the electrical connector 100. Furthermore, the broadside-coupling region 250 may include one or more signal traces that extend for less than the total crosstalk-reducing distance $D_{CRT1}$. For example, as shown in FIG. 8, the signal trace 234 may not extend for the entire crosstalk-reducing distance $D_{CRT1}$.

In addition to changing the separation distances SD and the crosstalk-reducing distance $D_{CRT}$, an arrangement of the signal traces 233-236 with respect to each other may be changed. For example, the signal traces 233-236 have a different arrangement than the mating conductors 116 (FIG. 1) at the mating interface 136 (FIG. 2). More specifically, the signal traces 233 and 234 are switched as compared to the mating conductors −3 and +4 shown in FIG. 3. Accordingly, the printed circuit 124 may effectively provide a cross-over that changes an electrical relationship between the signal traces 233-236.

In other embodiments, the broadside-coupling region 250 only includes three signal traces. Furthermore, in other embodiments, more than one broadside-coupling region may exist within the printed circuit 124. Furthermore, the signal traces 233-236 in the broadside-coupling region may have different dimensions. For example, the signal traces 233-236 may have different widths.

Figure 9:
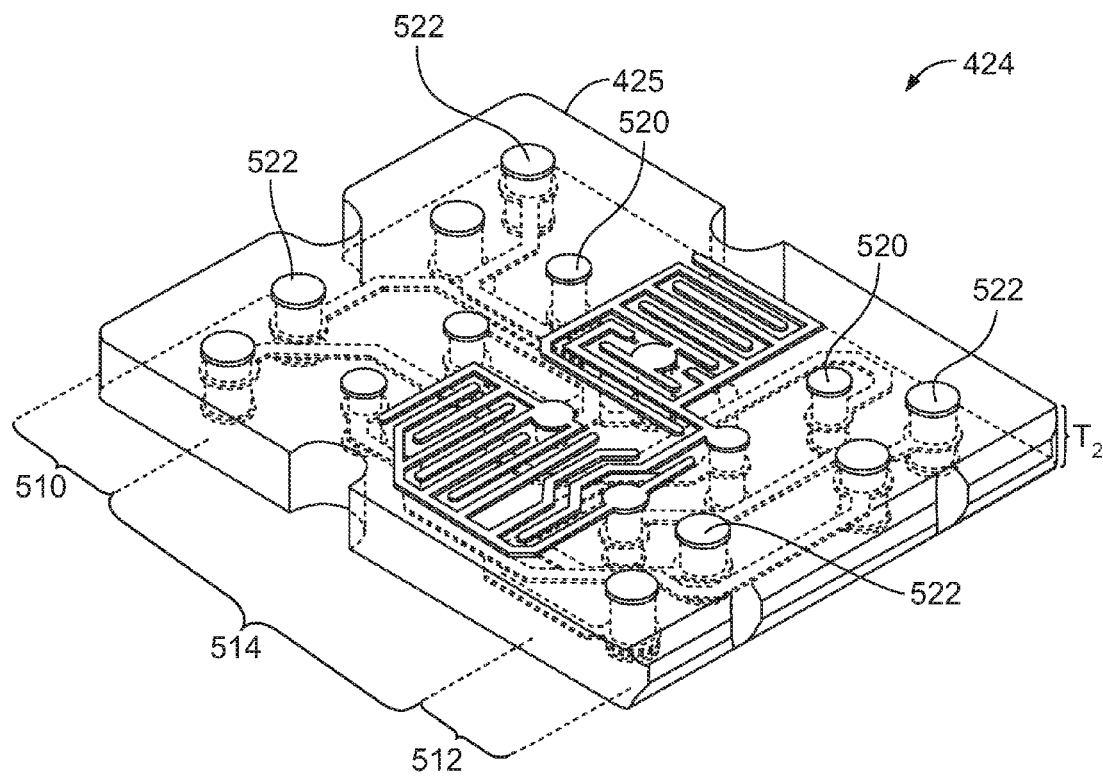
FIG. 9 is a perspective view of another printed circuit formed in accordance with one embodiment that may be used with the connector of FIG. 1.
Figure 15:
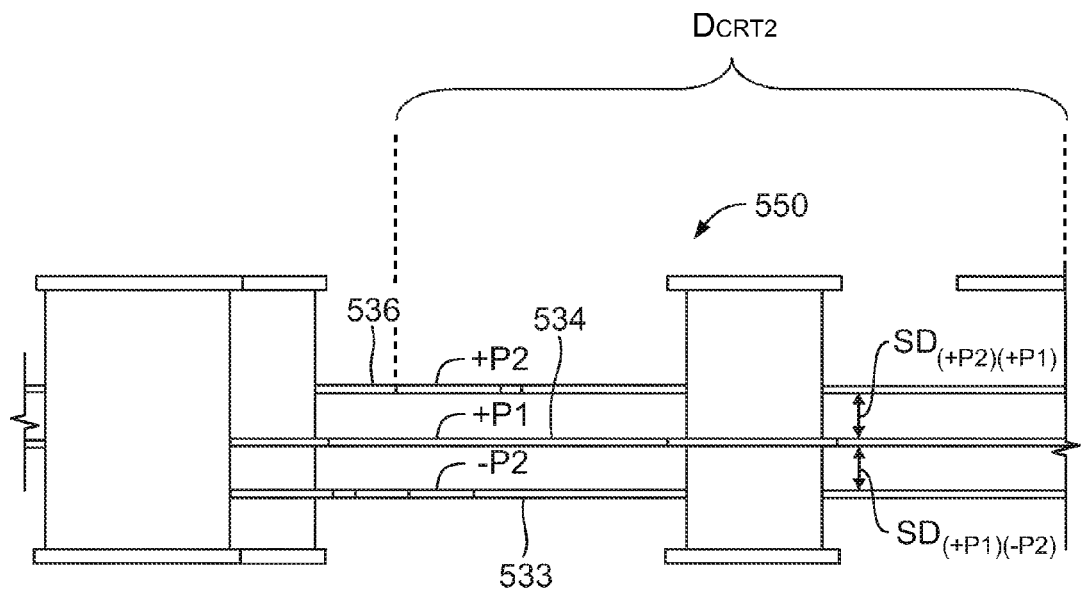
FIG. 15 is a side view of a portion of the printed circuit of FIG. 9 illustrating relative positions of the signal traces in a broadside-coupling region.

FIG. 9 is a perspective view of another printed circuit 424 formed in accordance with one embodiment that may be used with embodiments described herein, such as the electrical connector 100 (FIG. 1) or 600 (FIG. 15). The printed circuit 424 includes a dielectric substrate 425 and may have similar features, elements, and components as the printed circuit 124 and the dielectric substrate 425 described above. As shown, the printed circuit 424 is a circuit board and the dielectric substrate 425 is a board substrate. The dielectric substrate 425 may include a plurality of signal layers $SL_{A1}$-$SL_{A4}$ (shown in FIGS. 10-13, respectively) that comprise a dielectric material. The signal layers $SL_{A1}$-$SL_{A4}$ may be stacked with respect to each other along a thickness $T_2$ of the dielectric substrate 425.

Also shown, the printed circuit 424 or the dielectric substrate 425 may have opposite end portions 510 and 512 and a center portion 514 that extends between the end portions 510 and 512. The printed circuit 424 may include input terminals 520 that are attached to the dielectric substrate 425 and located in the center portion 514. The printed circuit 424 may also include output terminals 522 that are attached to the dielectric substrate 425 and located in the end portions 510 and 512. In the illustrated embodiment, the input terminals 520 and the output terminals 522 are plated thru-holes or vias. The input terminals 520 may be configured to electrically connect to intermediate contacts (not shown), and the output terminals 522 may be configured to electrically connect to terminal contacts (not shown).

Figure 10:
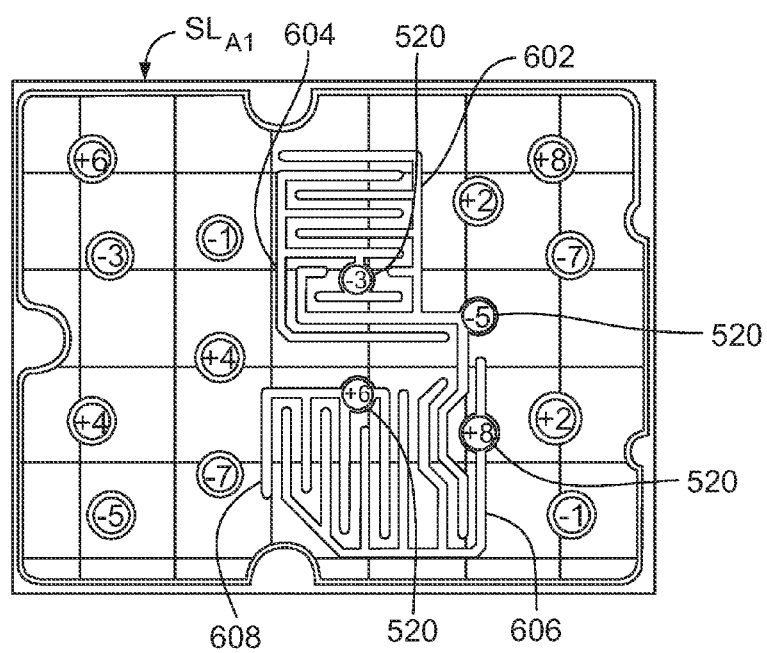
FIG. 10 is a plan view of one signal layer in the printed circuit of FIG. 9.

FIGS. 10-13 are separate elevation views of the signal layers $SL_{A1}$-$SL_{A4}$, respectively. As shown in FIG. 10, a first signal layer $SL_{A1}$ may include digital fingers 602 that are electrically connected to the input terminal 520 associated with the mating conductor −5 and digital fingers 604 that are electrically connected to the input terminal 520 associated with the mating conductor −3. The digital fingers 602 and 604 may extend alongside each other and provide edge-to-edge capacitive coupling therebetween. Likewise, the first signal layer $SL_{A1}$ may include digital fingers 606 that are electrically connected to the input terminal 520 associated with the mating conductor +8 and digital fingers 608 that are electrically connected to the input terminal 520 associated with the mating conductor +6. The digital fingers 606 and 608 may extend alongside each other and provide edge-to-edge capacitive coupling therebetween. Also shown, one of the digital fingers 602 that is associated with the mating conductor −5 may capacitatively couple to two digital fingers 606 that are associated with the mating conductor +8.

It should be noted that the digital fingers 602 and 604 and the digital fingers 606 and 608 that are shown in FIG. 10 are optional. For example, in some embodiments, the printed circuit 424 does not include the digital fingers 602 and 604 and/or does not include the digital fingers 606 and 608. Furthermore, in one alternative embodiment, the one digital finger 602 that capacitatively couples to two digital fingers 606 as shown in FIG. 10 may be removed. This effectively removes the capacitive coupling between the mating conductor −5 and the mating conductor +8, while maintaining the capacitive coupling between the mating conductor −3 and the mating conductor −5 as well as the capacitive coupling between the mating conductor +6 and the mating conductor +8. Moreover, digital fingers may be located on other signal layers. Thus, the digital fingers may or may not be used in various embodiments of the electrical connector 100. In those embodiments that include digital fingers, the digital fingers can have various configurations to control an electrical performance of the electrical connector 100.

Figure 11:
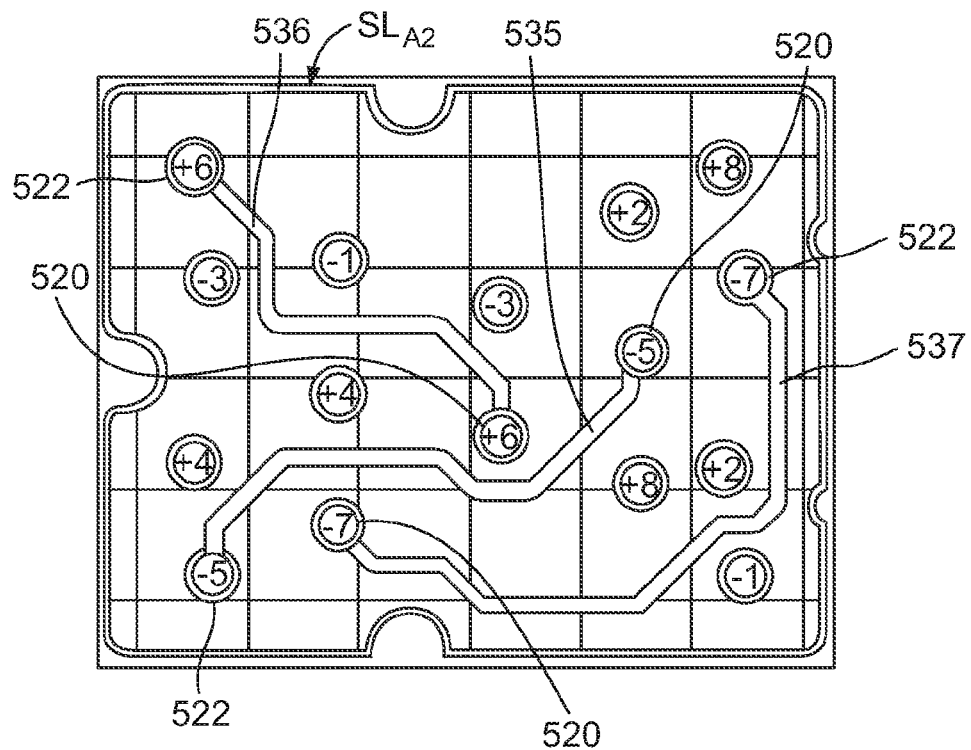
FIG. 11 is a plan view of another signal layer in the printed circuit shown in FIG. 9.
Figure 12:
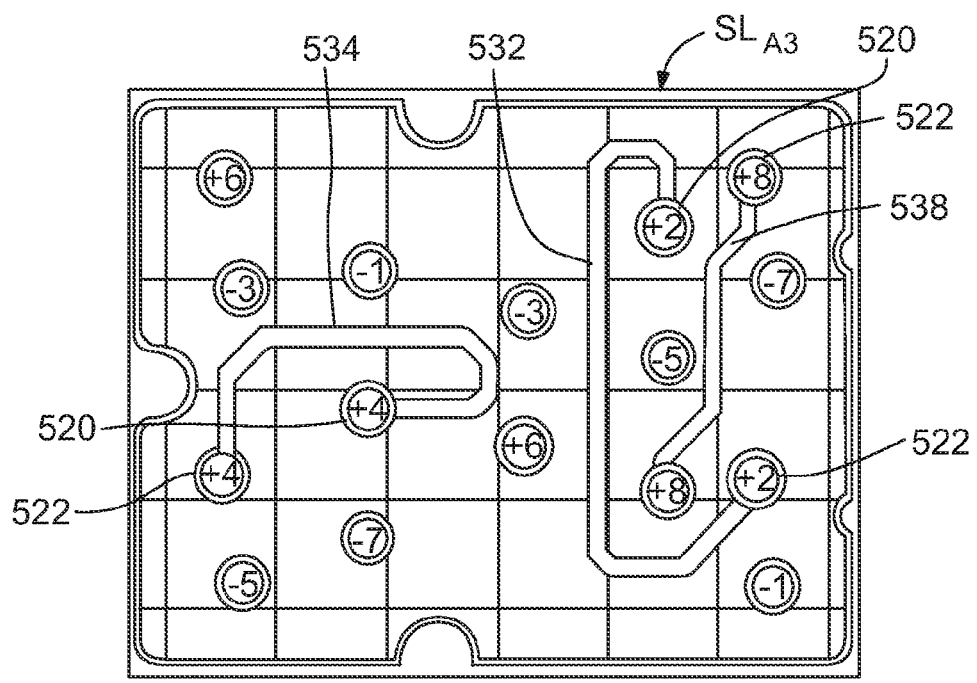
FIG. 12 is a plan view of another signal layer in the printed circuit shown in FIG. 9.
Figure 13:
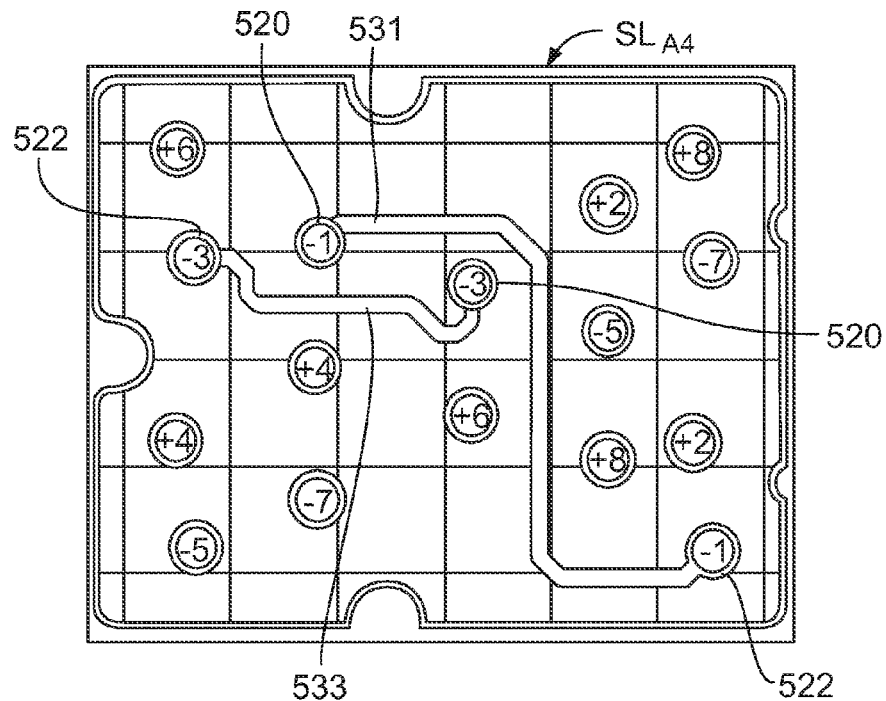
FIG. 13 is a plan view of another signal layer in the printed circuit shown in FIG. 9.

FIG. 11 illustrates a second signal layer $SL_{A2}$ that may be located below the first signal layer $SL_{A1}$. The signal layer $SL_{A2}$ may include signal traces 535-537 that electrically connect the associated pairs of input and output terminals 520 and 522 corresponding to the mating conductors 5-7, respectively. The signal traces 535-537 may extend along a common plane. With respect to FIG. 12, a third signal layer $SL_{A3}$ may include signal traces 532, 534, and 538 that electrically connect the associated pairs of input and output terminals 520 and 522 corresponding to the mating conductors 2, 4, 8, respectively. The signal traces 532, 534, and 538 may also extend along a common plane. The third signal layer $SL_{A3}$ may be located below the second signal layer $SL_{A2}$. FIG. 13 illustrates a fourth signal layer $SL_{A4}$ that includes signal traces 531 and 533 that electrically connect the associated pairs of input and output terminals 520 and 522 corresponding to the mating conductors 1 and 3, respectively. The signal traces 531 and 533 may also extend along a common plane. The fourth signal layer $SL_{A4}$ may be located below the third signal layer $SL_{A3}$. Although the above description is with respect to the signal layers $SL_{A1}$-$SL_{A4}$, the printed circuit 424 may have additional signal layers SL that may be, for example, inserted between the signal layers $SL_{A1}$-$SL_{A4}$.

Figure 14:
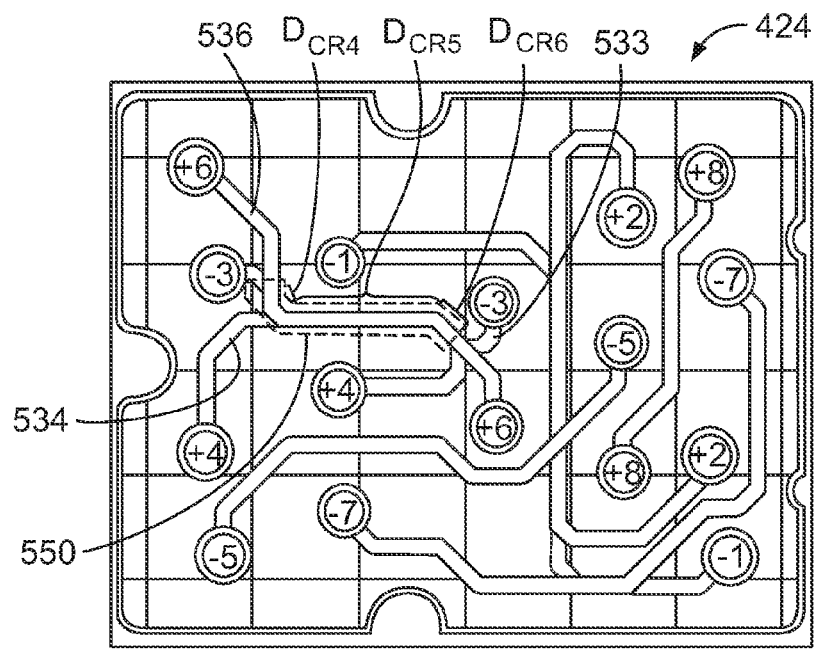
FIG. 14 is an elevation view of the printed circuit shown in FIG. 9 illustrating an arrangement of input and output terminals and signal traces.

FIG. 14 is an elevation view of the printed circuit 424 showing the signal layers $SL_{A2}$-$SL_{A4}$ stacked with respect to each other. (For illustrative purposes, the signal layer $SL_{A1}$ has been removed.) As shown, the printed circuit 424 may also include a broadside-coupling region 550 (indicated by the dashed lines). The broadside-coupling region 550 includes the signal traces 533, 534, and 536, which are stacked with respect to one another to form the broadside-coupling region 550. The signal traces 533, 534, and 536 extend parallel to one another for a crosstalk-reducing distance $D_{CRT2}$ (shown in FIG. 15). The crosstalk reducing distance $D_{CRT2}$ may include three separate components $D_{CR4}$, $D_{CR5}$, and $D_{CR6}$. The sum of $D_{CR4}$, $D_{CR5}$, and $D_{CR6}$ equals the total crosstalk-reducing distance $D_{CRT2}$. The crosstalk-reducing distance $D_{CRT2}$ may be configured to facilitate compensating for the offensive crosstalk.

In the illustrated embodiment, the broadside-coupling region 550 includes the signal traces 533 and 536 that are communicatively coupled to the mating conductors 3 and 6 of the split differential pair P2. The broadside-coupling region 550 also includes the signal trace 534 that is communicatively coupled to the mating conductors 4 of the differential pair P1. The broadside-coupling region 550 may be configured to facilitate compensating for the offensive crosstalk or to obtain a desired performance. Although not shown, the signal traces 536, 534, and 533 may be equally spaced apart. More specifically, a separation distance that extends between the signal traces 536 and 534 may be substantially equal to a separation distance that extends between the signal traces 534 and 533. Furthermore, the broadside-coupling region 550 may only include the three signal traces 536, 534, and 533.

FIG. 15 is a side view of a portion of the printed circuit 424 (FIG. 9) illustrating relative positions of the signal traces 536, 534, and 533 in the broadside-coupling region 550. As shown, in FIG. 15, the signal traces 536 and 534 are spaced apart by a separation distance $SD_{(+P2)(+P1)}$ and the signal traces 534 and 533 are spaced apart by a separation distance $SD_{(+P1)(-P2)}$. The separation distances $SD_{(+P2)(+P1)}$ and $SD_{(+P1)(-P2)}$ may be re-configured for a desired performance.

The signal traces forming broadside-coupling regions in a printed circuit, such as those described herein, may have various configurations and arrangements. For example, Table 1 shown below illustrates various combinations of signal traces in broadside-coupling regions. In Table 1, each signal trace is identified between a pair of parentheses and is identified by a polarity and a differential pair number. For example, the signal trace 536 would be identified as (+P2). As shown in the left-hand column of Table 1, printed circuits may include broadside-coupling regions having only two signal traces. In such embodiments, one signal trace of either a negative or positive polarity of a first differential pair electromagnetically couples to a second signal trace of either a negative or positive polarity of a second (i.e., different or separate) differential pair. As shown in Table 1, a total of four coupling combinations between the two different differential pairs may be formed (i.e., four different arrangements of the signal traces may be configured).

As shown in the middle column of Table 1, printed circuits may include broadside-coupling regions having only three signal traces. In such embodiments, one signal trace of either a negative or positive polarity of a first differential pair is located between and electromagnetically couples to two signal traces of a second differential pair. The first signal trace of the second differential pair will have a polarity opposite (or 180 degrees out of phase with respect to) the second signal trace of the second differential pair. Accordingly, a total of eight coupling combinations between the two different differential pairs may be formed with three signal traces (i.e., eight different arrangements of the three signal traces may be configured).

As shown in the right-hand column, printed circuits may include broadside-coupling regions having only four signal traces. In such embodiments, two signal traces of a first differential pair are located between and electromagnetically couple to two signal traces of a second differential pair. The first signal trace of the first differential pair will have a polarity opposite (or 180 degrees out of phase with respect to) the second signal trace of the first differential pair. Also, the first signal trace of the second differential pair will have a polarity opposite (or 180 degrees out of phase with respect to the) second signal trace of the second differential pair. Accordingly, a total of eight coupling combinations between the two different differential pairs may be formed with four signal traces. Thus, in some embodiments, the signal traces of one differential pair do not extend adjacent to each other in a broadside-coupling region. In other words, the signal traces of a first differential pair have at least one signal trace from a second (or different or separate) differential pair between signal traces of the first differential pair.

In particular embodiments where three or four signal traces are arranged in the broadside-coupling region, both the magnitude and phase that exist in a NEXT stage can be dynamically tuned as opposed to a broadside-coupling region with only two signal traces. In a broadside coupling region with only two signal traces, only the magnitude of a NEXT stage can be dynamically tuned. The polarity of this region is limited to either a 0° or 180° phase shift depending on which 2-signal trace coupling combinations are used (Table 1). However, in broadside-coupling regions with three or four signal traces, both the magnitude and phase of a NEXT stage can be tuned by locating at least one signal trace of either a positive or negative polarity of a first differential pair between two signal traces of a second differential pair in a broadside-coupling region. Furthermore, by varying the separation distances between the signal traces, the polarity and the magnitude can be tuned to a desired performance. Unlike existing connectors, the polarity and the magnitude can be tuned regardless of a location of the NEXT stage along an interconnection path.

TABLE 1

| Crosstalk Coupling Permutations Between Two Differential Pairs | | | | |
|---|---|---|---|---|
| 2-Signal traces | 3-Signal traces | | 4-Signal traces | |
| (−P2)(+P1) | (−P2)(+P1)(+P2) | (−P1)(−P2)(+P1) | (−P2)(+P1)(+P2)(−P1) | (−P1)(−P2)(+P1)(+P2) |
| (−P2)(−P1) | (−P2)(−P1)(+P2) | (−P1)(+P2)(+P1) | (−P2)(−P1)(+P2)(+P1) | (−P1)(+P2)(+P1)(−P2) |
| (+P2)(+P1) | (+P1)(−P2)(+P1) | (+P2)(+P1)(−P2) | (+P1)(−P2)(−P1)(+P2) | (+P2)(+P1)(−P2)(−P1) |
| (+P2)(−P1) | (+P1)(+P2)(−P1) | (+P2)(−P1)(−P2) | (+P1)(+P2)(−P1)(−P2) | (+P2)(−P1)(+P2)(−P1) |

Figure 16:
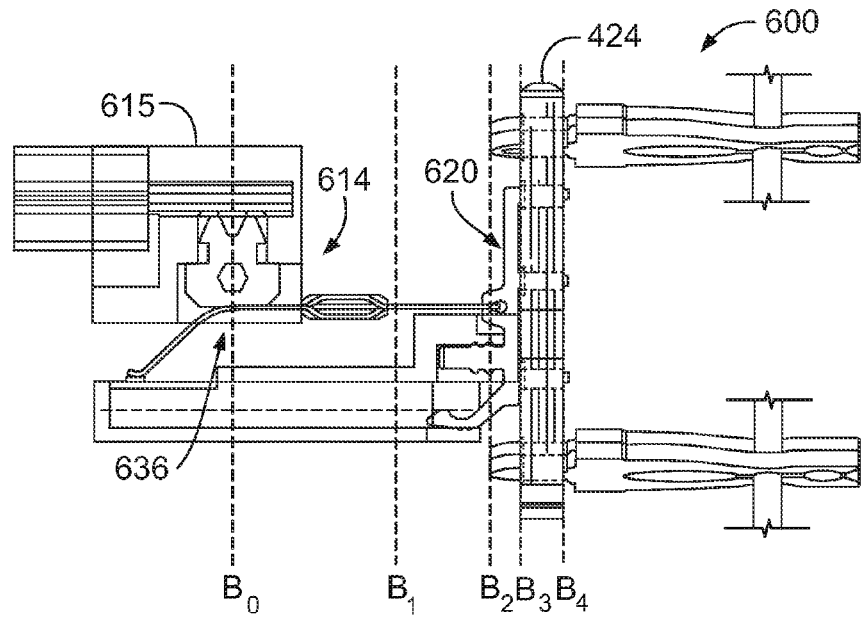
FIG. 16 is a schematic side view of an electrical connector having the printed circuit of FIG. 9.

FIG. 16 is a schematic side view of an electrical connector 600 having the printed circuit 424. FIG. 16 illustrates sections of the electrical connector where crosstalk vectors $B_0$, $B_1$, $B_2$, $B_3$, and $B_4$ may be measured for the electrical connector 600. FIG. 17 is a schematic diagram of crosstalk that occurs between differential pairs P1 and P2 in the electrical connector 600 in a five NEXT stage compensation scheme.

As shown in FIG. 18, the crosstalk vectors $B_0(0)$, $B_1(0)$, $B_2(0)$, $B_3(0)$, and $B_4(0)$ (indicated by dashed arrows in FIG. 18) represent the magnitude and polarity of the offending crosstalk or compensation crosstalk at different stages of the electrical connector 600 without the influence of the time delay. More specifically, the vector $B_0(0)$ represents the offending crosstalk at Stage 0 that occurs at a mating interface 636 (FIG. 16) between a modular plug 615 (FIG. 16) and mating conductors 614 (FIG. 16) of the electrical connector 600. The vector $B_1(0)$ represents the magnitude and polarity of compensation crosstalk at Stage I that may occur due to the mating conductors +4 and −5 crossing-over one another without the influence of the time delay. The vector $B_2(0)$ represents the magnitude and polarity of compensation crosstalk at Stage II that may occur between intermediate contacts 620 without the influence of the time delay. The vector $B_3(0)$ represents the magnitude and polarity of compensation crosstalk at Stage III that may occur along a surface of the printed circuit 424 and the input terminals 520 (FIG. 9) extending therethrough without the influence of the time delay. The vector $B_4(0)$ represents compensation crosstalk at Stage IV that may occur between the signal traces 533, 534, and 536 (FIG. 14) within the broadside-coupling region 550 (FIG. 14).

The vector $B_4(0)$ illustrates that a change in polarity relative to the vector $B_3(0)$ is no longer limited to a 0° and 180° phase shift. By varying the separation distances SD between the three signal traces in the broadside-coupling region, the polarity and the magnitude of a NEXT stage can be tuned to a desired performance level. As a result, unlike known electrical connectors, this tuning technique may be used regardless of where a NEXT stage occurs along the interconnection path.

In order to effectively reduce the effects of the offending crosstalk that occur at Stage 0, the crosstalk generated in Stage 0 should be reduced or effectively cancelled by the compensation crosstalk generated in Stages I-IV. FIGS. 19-22 illustrate vector diagrams of the vector addition of the various NEXT stages that occur. Each of FIGS. 19-22 illustrate a resultant vector (indicated by dashed lines) that represent an effect that the corresponding NEXT stage may have on crosstalk. The NEXT stages may be configured to reduce or effectively cancel the offending crosstalk. For example, with respect to FIG. 19, the vector $B_0(0°)$ represents the magnitude and the total phase of offending crosstalk at Stage 0 that may occur due to mating surface 132 (FIG. 2) between the modular plug 102 (FIG. 2) and the contact subassembly 110 (FIG. 2). The vector $B_1(\phi_1)$ represents the magnitude and total phase delay of compensation crosstalk at Stage I that may occur due to the mating conductors +4 and −5 crossing-over one another. The total phase delay of vector $B_1$ is comprised of the polarity relative to $B_0$ and the phase delay, $\phi_1$, due to time it takes a signal to travel between Stage 0 and Stage I. The vector $B_I(\Psi_I)$ is the resultant vector of the magnitude and phase of vector $B_0(0°)$ added to the magnitude and phase of vector $B_1(\phi_1)$.

Figure 20:
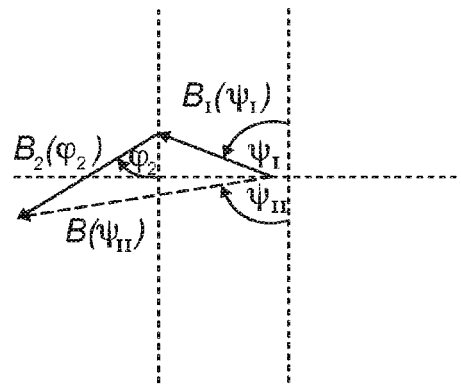
FIG. 20 illustrates, through vector addition, an effect that NEXT stage $B_2$ has on crosstalk for the electrical connector shown in FIG. 16.

With respect to FIG. 20, the vector $B_2(\phi_2)$ represents the magnitude and total phase delay of compensation crosstalk at Stage II that may occur between intermediate contacts 620. The total phase delay of vector $B_2$ is comprised of the polarity relative to $B_1$ and the phase delay, $\phi_2$, due to time it takes a signal to travel between Stage I and Stage II. The vector $B_{II}(\Psi_{II})$ is the resultant vector of the magnitude and phase of vector $B_I(\Psi_I)$ added to the magnitude and phase of vector $B_2(\phi_2)$.

Figure 21:
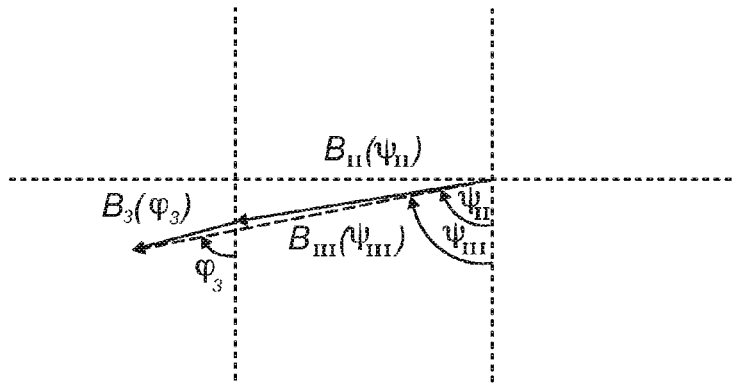
FIG. 21 illustrates, through vector addition, an effect that NEXT stage $B_3$ has on crosstalk for the electrical connector shown in FIG. 16.

With respect to FIG. 21, the vector $B_3(\phi_3)$ represents the magnitude and total phase delay of compensation crosstalk at Stage III that may occur along a surface of the printed circuit 424 and the input terminals 520, The total phase delay of vector $B_3$ is comprised of the polarity relative to $B_2$ and the phase delay, $\phi_3$, due to time it takes a signal to travel between Stage II and Stage III. The vector $B_{III}(\Psi_{III})$ is the resultant vector of the magnitude and phase of vector $B_{II}(\Psi_{II})$ added to the magnitude and phase of vector $B_3(\phi_3)$.

Figure 22:
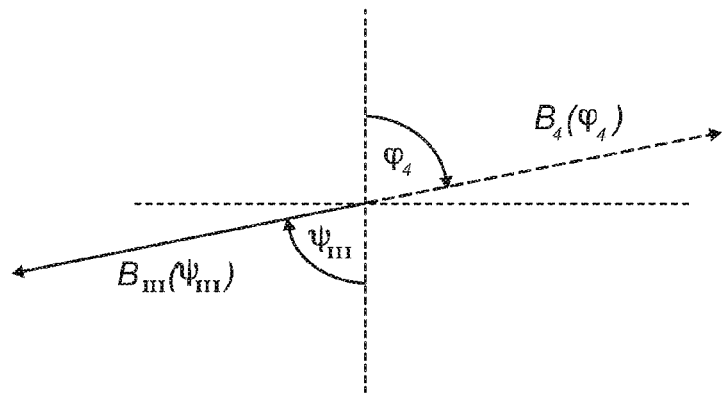
FIG. 22 illustrates, through vector addition, an effect that NEXT stage $B_4$ has on crosstalk for the electrical connector shown in FIG. 16.

With respect to FIG. 22, the vector $B_4(\phi_4)$ represents the magnitude and total phase delay of compensation crosstalk at Stage IV that may occur between the signal traces 533, 534, and 536 within the broadside-coupling region 550. The total phase delay of vector $B_4$ is comprised of the polarity relative to $B_3$ and the phase delay, $\phi_4$, due to time it takes a signal to travel between Stage III and Stage IV. The magnitude and phase of vector $B_4(\phi_4)$ is approximately equivalent to the magnitude and phase of vector $-B_{III}(\Psi_{III})$. When vector $B_4(\phi_4)$ is added to $-B_{III}(\Psi_{III})$, the resultant vector may be configured to be approximately equal to zero.

Furthermore, by selecting the locations of crossovers and/or discrete components an amount of electromagnetic coupling between the differential pairs P1 and P2 and the individual conductive elements associated with the differential pairs P1 and P2 (e.g., mating conductors 614, intermediate contacts 620, and input terminals 520), the magnitude and phase of crosstalk vectors $B_1$, $B_2$, and $B_3$, can be selected to reduce or cancel the offending crosstalk. Furthermore, by selecting the dimensions of the signal traces 533, 534, and 536, the corresponding separation distances, and the crosstalk-reducing distance $D_{CRT2}$, the magnitude and phase of the crosstalk vectors $B_4$ can be selected to improve the electrical performance of the electrical connector 600.

Embodiments described herein include electrical connectors and printed circuits. In particular embodiments, the mating conductors may include first and second differential pairs of mating conductors. The first differential pair may be located between the mating conductors of the second differential pair thereby generating offensive crosstalk when the mating conductors and plug contacts are engaged at a mating interface. Each of the at least two signal traces may be communicatively coupled to one mating conductor of the first differential pair or the second differential pair. Moreover, in particular embodiments, the signal traces include first, second, and third signal traces. The first, second, and third signal traces may be equally spaced apart from each other in the broadside-coupling region.

Exemplary embodiments are described and/or illustrated herein in detail. The embodiments are not limited to the specific embodiments described herein, but rather, components and/or steps of each embodiment may be utilized independently and separately from other components and/or steps described herein. Each component, and/or each step of one embodiment, can also be used in combination with other components and/or steps of other embodiments. For example, the coupling regions as described with respect to FIGS. 8-12 may or may not be used in conjunction with the arrangement of conductive and terminal vias as described with respect to FIGS. 5-7.

When introducing elements/components/etc. described and/or illustrated herein, the articles "a", "an", "the", "said", and "at least one" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc. Moreover, the terms "first," "second," and "third," etc. in the claims are used merely as labels, and are not intended to impose numerical requirements on their objects. Dimensions, types of materials, orientations of the various components, and the number and positions of the various components described and/or illustrated herein are intended to define parameters of certain embodiments, and are by no means limiting and are merely exemplary embodiments. Many other embodiments and modifications within the spirit and scope of the claims will be apparent to those of skill in the art upon reviewing the description and illustrations. The scope of the subject matter described and/or illustrated herein should therefore be determined with reference to the appended claims, along with the full scope of equivalents to which such claims are entitled. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

While the subject matter described and/or illustrated herein has been described in terms of various specific embodiments, those skilled in the art will recognize that the subject matter described and/or illustrated herein can be practiced with modification within the spirit and scope of the claims.

What is claimed is:

1. An electrical connector configured to communicate differential signals, the electrical connector comprising:
mating conductors configured to engage contacts of another connector, the mating conductors comprising first and second differential pairs; and
a circuit board including a plurality of signal traces and a plurality of associated pairs of terminals, each of the associated pairs including an input terminal and an output terminal that are electrically connected through one of the signal traces of said plurality, the input terminals being electrically connected to corresponding mating conductors, each of the signal traces having a conductive path that is configured to transmit signal current between the associated input and output terminals, the signal traces including first and second signal traces that are associated with the first differential pair of signals and third and fourth signal traces that are associated with the second differential pair of signals;
wherein the first, second, and third signal traces are stacked and spaced apart from each other to form a broadside-coupling region, the first, second, and third signal traces extending parallel to one another through the broadside-coupling region for a crosstalk-reducing distance.

2. The electrical connector of claim 1, wherein the broadside coupling region is configured to compensate for a designated amount of offensive crosstalk that is generated within the electrical system.

3. The electrical connector of claim 1, wherein the first, second, and third signal traces are equally spaced apart from each other in the broadside-coupling region.

4. The electrical connector of claim 1, wherein the fourth signal trace also extends parallel to the first, second, and third signal traces in the broadside-coupling region.

5. The electrical connector of claim 1, wherein the first, second, and third signal traces have a substantially common width in the broadside-coupling region, the broadside-coupling region having a width that is approximately equal to the common width.

6. The electrical connector of claim 1, wherein the broadside-coupling region has a non-linear shape such that the conductive paths of the first, second, and third signal traces simultaneously change direction in the same direction at least once in the broadside-coupling region.

7. The electrical connector of claim 1, wherein the first, second, and third signal traces have a common width in the broadside-coupling region, the crosstalk-reducing distance being greater than at least three times the common width.

8. The electrical connector of claim 1, wherein the third signal trace is positioned between the first and second signal traces in the broadside-coupling region and wherein the fourth signal trace extends parallel to the first, second, and third signal traces in the broadside-coupling region, the second signal trace extending between the third and fourth signal traces.

9. An electrical system configured to communicate differential signals, the system comprising:
a printed circuit including a plurality of signal traces and a plurality of associated pairs of terminals, each of the associated pairs including an input terminal and an output terminal that are electrically connected through one of the signal traces of said plurality, each of the signal traces having a conductive path that is configured to transmit signal current between the associated input and output terminals, the signal traces including first and second signal traces that transmit a first differential pair of signals and third and fourth signal traces that transmit a second differential pair of signals;
wherein the first, second, and third signal traces are stacked and spaced apart from each other to form a broadside-coupling region, the first, second, and third signal traces extending parallel to one another through the broadside-coupling region for a crosstalk-reducing distance.

10. The electrical system of claim 9, wherein the broadside coupling region is configured to compensate for a designated amount of offensive crosstalk that is generated within the electrical system.

11. The electrical system of claim 9, wherein the first, second, and third signal traces are equally spaced apart from each other in the broadside-coupling region.

12. The electrical system of claim 9, wherein the fourth signal trace also extends parallel to the first, second, and third signal traces in the broadside-coupling region.

13. The electrical system of claim 9, wherein the printed circuit includes a board substrate having opposite end portions and a center portion that extends between the end portions, the input terminals being located in the center portion and the output terminals being located in the end portions.

14. The electrical system of claim 13, wherein the input terminals that are electrically connected to the first, second, and third signal traces are located in the center portion and the output terminals that are electrically connected to the first, second, and third signal traces are located at a common end portion.

15. The electrical system of claim 9, wherein the first, second, and third signal traces have a substantially common width in the broadside-coupling region, the broadside-coupling region having a width that is approximately equal to the common width.

16. The electrical system of claim 9, wherein the broadside-coupling region has a non-linear shape such that the conductive paths of the first, second, and third signal traces simultaneously change direction in the same direction at least once in the broadside-coupling region.

17. The electrical system of claim 9, wherein the first, second, and third signal traces have a common width in the broadside-coupling region, the crosstalk-reducing distance being greater than at least three times the common width.

18. The electrical system of claim 9, wherein the printed circuit is a circuit board.

19. The electrical system of claim 9, wherein the third signal trace is positioned between the first and second signal traces in the broadside-coupling region.

20. The electrical system of claim 19, wherein the fourth signal trace extends parallel to the first, second, and third signal traces in the broadside-coupling region, the second signal trace extending between the third and fourth signal traces.

* * * * *